(12) United States Patent
Daubenspeck et al.

(10) Patent No.: US 8,809,182 B2
(45) Date of Patent: Aug. 19, 2014

(54) PAD CUSHION STRUCTURE AND METHOD OF FABRICATION FOR PB-FREE C4 INTEGRATED CIRCUIT CHIP JOINING

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/113,230

(22) Filed: May 1, 2008

(65) Prior Publication Data
US 2009/0273081 A1   Nov. 5, 2009

(51) Int. Cl.
*H01L 21/44* (2006.01)

(52) U.S. Cl.
USPC ............ 438/613; 257/735; 257/737; 438/612

(58) Field of Classification Search
USPC ........... 257/737, 738, 668; 438/126, 612, 613
See application file for complete search history.

(56) References Cited

U.S. PATENT DOCUMENTS

| | | | | |
|---|---|---|---|---|
| 5,677,847 | A * | 10/1997 | Walling | 716/129 |
| 6,300,234 | B1 * | 10/2001 | Flynn et al. | 438/612 |
| 6,459,125 | B2 | 10/2002 | Maeda et al. | |
| 6,822,317 | B1 * | 11/2004 | Inoue et al. | 257/668 |
| 6,841,853 | B2 | 1/2005 | Yamada | |
| 6,946,723 | B2 | 9/2005 | Satoh et al. | |
| 7,012,018 | B2 | 3/2006 | Tellkamp | |
| 7,132,303 | B2 | 11/2006 | Wang et al. | |
| 7,205,181 | B1 * | 4/2007 | MacIntyre | 438/126 |
| 7,208,841 | B2 | 4/2007 | Wang et al. | |
| 2002/0130412 | A1 * | 9/2002 | Nagai et al. | 257/737 |
| 2006/0202291 | A1 * | 9/2006 | Kolb et al. | 257/421 |
| 2007/0080455 | A1 * | 4/2007 | Zupanski-Nielsen et al. | 257/738 |
| 2007/0096313 | A1 | 5/2007 | Chou et al. | |

FOREIGN PATENT DOCUMENTS

| | | |
|---|---|---|
| JP | 01209746 | 8/1989 |
| JP | 10092865 | 4/1998 |

OTHER PUBLICATIONS

Richard A. Larsen, "A Silicon and Aluminum Dynamic Memory Technology",IBM J. Res. Develop., vol. 24, No. 3, May 1980, pp. 268-282.

* cited by examiner

*Primary Examiner* — Errol Fernandes
(74) *Attorney, Agent, or Firm* — David Cain; Roberts Mlotkowski Safran & Cole, P.C.

(57) ABSTRACT

A controlled collapse chip connection (C4) method and integrated circuit structure for lead (Pb)-free solder balls with stress relief to the underlying insulating layers of the integrated circuit chip by disposing soft thick insulating cushions beneath the solder balls and connecting the metallization of the integrated circuit out-of-contact of the cushions but within the pitch of the solder balls.

20 Claims, 4 Drawing Sheets

FIG. 1 (PRIOR ART)
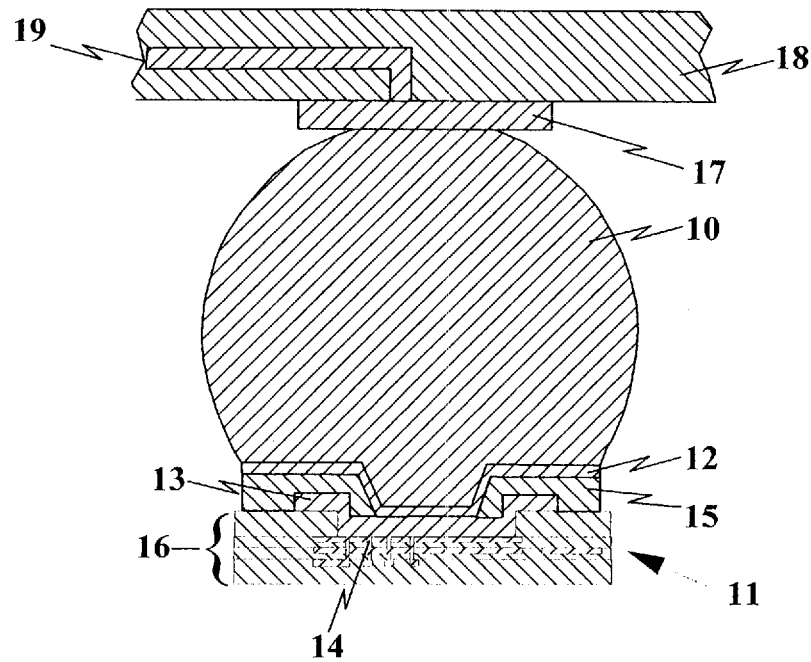
FIG. 2 (Prior Art - Test Structure)
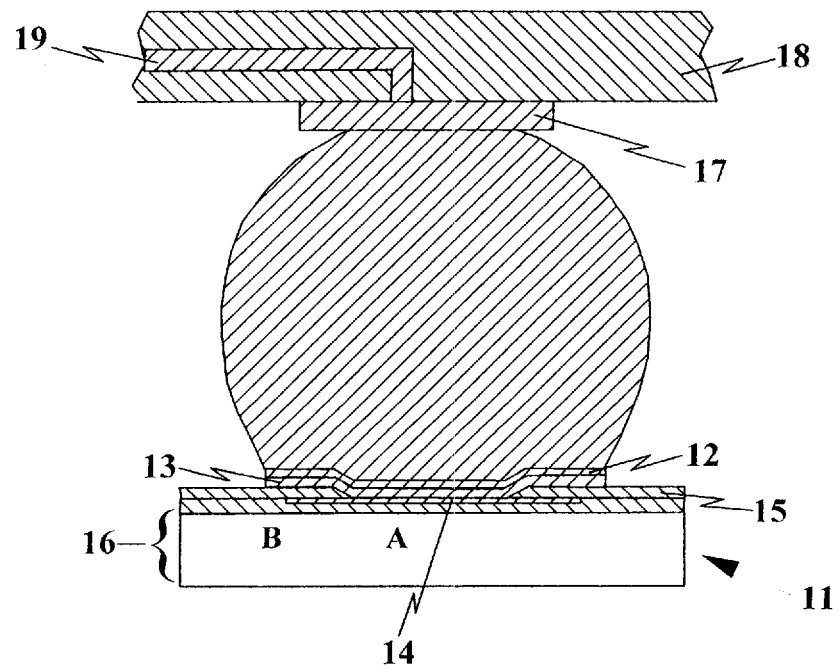

PAD CUSHION STRUCTURE AND METHOD OF FABRICATION FOR PB-FREE C4 INTEGRATED CIRCUIT CHIP JOINING

FIELD OF THE INVENTION

The present invention relates, in general, to the structure of integrated circuit chips and a method of fabrication and, more specifically to the structure of interconnections for Controlled Collapse Chip Connection (C4) or flip-chip assembly of integrated circuit chips and the fabrication thereof.

BACKGROUND OF THE INVENTION

Controlled Collapse Chip Collection (C4) is a technology where a semiconductor chip is interconnected to its package by an array of solder balls on the top or face of the chip. C4 offers a high input/output density by positioning solder balls anywhere on the face of the chip. In addition, interconnection by very small solder balls lowers inductance, thereby enhancing overall electrical performance. Finally, C4 allows for lower process complexity due to the relaxation of pitch separation requirements between balls and the self-aligning property of C4 chip attach.

Briefly, the Controlled Collapse Chip Connection (C4) process comprises forming the desired number of input/output pads on both the chip and package in alignment, forming a Ball Limiting Metallurgy (BLM) at the pads of the chip followed by depositing solder balls on the BLM. To connect the chip to the package, the balls are aligned with their corresponding pads on the package and the chips and the package are heated to a temperature sufficient to melt and reflow the solder into balls to connect the pads on the package. Upon cooling, the input/output pads of the chips and package are physically connected. At the input/output pads, the BLM contains the flow of the solder in the solder balls while the balls are in their melted and reflow state.

From the inception of the C4 technology, the solder composition consisted of a combination of lead (Pb) and tin (Sn), normally with the Pb being the larger percentage to enable the proper reflow characteristics, while the Ball Limiting Metallurgy (BLM) contained no lead (Pb). Normally in the past, a high melt composition of, for example, 97/3 Pb/Sn was used. Because of the health hazard to humans by Pb, the use of Pb solder has been replaced by Pb-free solder in the electronics industry, including the C4 technology. However, it has been found that Pb-free solder creates undesirable stresses in the chip during chip joining and subsequent thermal processing to reflow the solder, stresses which were not present with the 97/3 Pb/Sn composition. These stresses, which occur at the Back End of the Line (BEOL), can initiate fracture below the BLM connection pad at points which appear in the form of discrete white spots when viewed using acoustic microscopy. For an organic package laminate configuration on which the chip is mounted, these stresses can be catastrophic, resulting in delaminating or breakage of structural elements located directly below the interconnect during processing at the BEOL. This situation is worse for "fine pitch" C4 technologies when the C4 density increases with a higher number of I/Os. A typical C4/BLM chip interconnect structure comprises, herein, an aluminum landing pad accessed through a via opening in a final insulating material, such as polyimide or a polyimide/silicon oxide/silicon nitride composite. The C4/BLM lies directly over this aluminum metal pad, which is positioned over and in a via structure in a hard insulating layer of herein silicon oxide/silicon nitride. The stresses, which includes a vertical tensile stress, are intrinsically related to thermal coefficient (TCE) mismatch between the chip and package laminate and are translated through the mechanically stiff or brittle Pb-free solder to the chip through this vertical interconnect, creating a separation of layers at the BEOL. These separations ultimately result in electrical opens either during reliability testing or by failure while operating in the field. The stresses causing these separations are at their highest where the final dielectric via edge contacts the metal pad, herein aluminum, in that the via edge acts to focus the stress effect locally. The stress is proportional to the via wall thickness or via height, but is generally reduced over the bulk insulating layer, herein polyimide, as a direct function of the thickness of the insulating layer.

SUMMARY OF THE INVENTION

Accordingly, the primary object of the present invention is fabricate C4 connections without stresses or electrical opens being caused by the particular metallization of the C4 solder.

Another object of the present invention is to minimize the stresses without resorting to a Pb containing solder.

A further object of the present invention is to not use a vertical path from the C4 connection to the wiring of the integrated circuit and yet maintain the capability of a fine pitch layout.

A still further object of the present invention is to provide a Pb-free solder C4 connection method without unduly complicating the steps in the fabrication method.

These and other objects and features of the present invention are accomplished by a method, and the resulting structure, of fabricating a C4 solder ball with a soft insulating cushion beneath the BLM and conductive pad. The method, and resulting structure, of forming the C4 solder ball comprises offsetting, from the C4 solder ball, a conductive wire and the pad of the last metal conductive layer to which the C4 connects.

BRIEF DESCRIPTION OF THE DRAWINGS

These and further features of the present invention will be apparent with reference to the following description of the present inventions along with the following FIGS. 1-6.

FIG. 1 (Prior Art) is a cross-sectional view of the C4 structure with Pb-free solder ball which results in stresses and delamination of the underlying layers during reflow.

FIG. 2 (Prior Art—Test Structure) is a cross-sectional view of a C4 test structure used to model stresses at points A and B in the prior art C4 design.

DETAILED DESCRIPTION OF THE INVENTION

Figure 3:
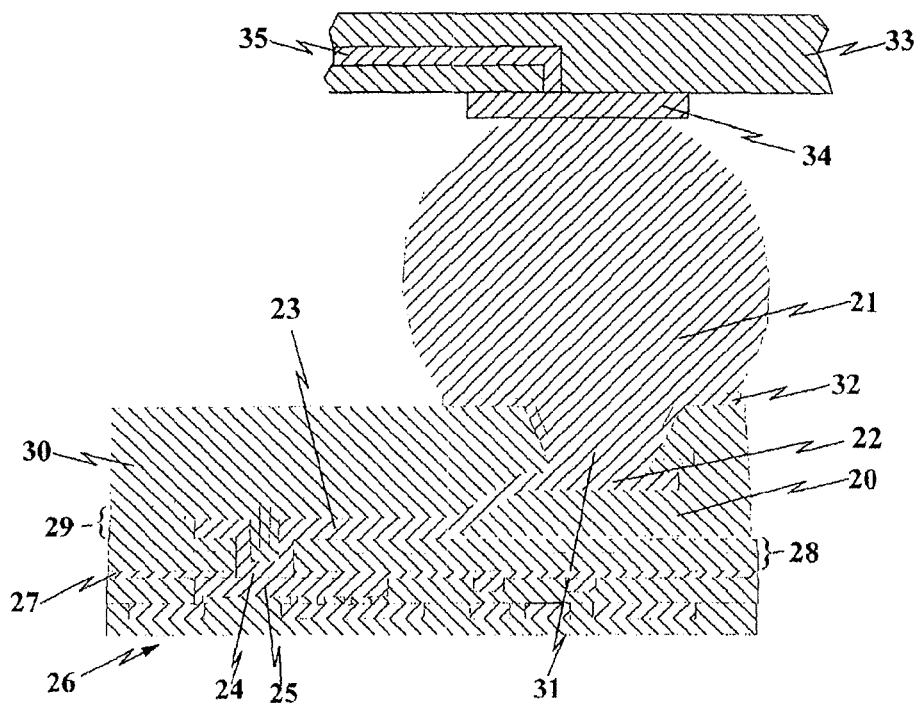
FIG. 3 is a cross-sectional view of the preferred embodiment of the C4 structure of the present invention.

As shown by the cross-sectional view of FIG. 1 (Prior Art), a lead (Pb) free C4 solder ball 10 is formed on the face of an integrated circuit chip 11 and connected to a layer 12 of ball limiting metal (BLM) which is connected to a metal line 13, herein aluminum, which, in turn, is connected to the last or final connection 14, herein copper, at the center of the solder ball 10. At the ends of the BLM, a thick insulating via 15, such as polyimide, is deposited between the BLM and the aluminum line 13. Because the final Cu connection 14 is vertically aligned with the C4 ball 10, there is no protection to stop damage by delaminating the insulating layers 16 due to stress during reflow to connect, at the back end of the line (BEOL), the solder ball 10 of the integrated circuit chip 11 to a conductive pad 17 on a package substrate 18 with conductive lines 19. The C4 solder ball comprises a tin (Sn) alloy, such as silver (SnAg), which is a stiff, brittle material and creates stress during reflow. In both FIG. 1 and FIG. 2, the solder ball 10 is shown connected to a conductive pad 17 which is attached to a package substrate 18 with conductive wires 19.

Modeling of the conventional C4 solder ball structure of Pb-free solder as shown in FIG. 2 (Prior Art—Test Structure) indicates the stress, which causes the fractures in the layers of the chip below the solder ball and show up as discrete white spots, concentrates through the ends of the thick insulating via 15 to focus delaminating force on the underlying insulation layers. The model was run at temperatures from 200° C. to 25° C. on a 7.35 mm chip with a 85 um thick BLM with a 40 um wide polyimide via having a 70 um height. The stresses were examined at points A and B as shown in FIG. 2 for 2, 3 and 4 um. It was found that the delaminating stress is proportional to the polyimide via height and inversely related to the polyimide thickness across the polyimide.

The chart below shows the relative stress at Point A of FIG. 2 as a function of depth in the oxide (i.e.—the thickness of oxide above the top of Cu lines) and as a function of polyimide thickness. Below the via 15, the greater the depth in the oxide and the thinner the polyimide, the lower the stress in the oxide.

CHART I

Relative Stress in Oxide under Via vs Polyimide Thickness

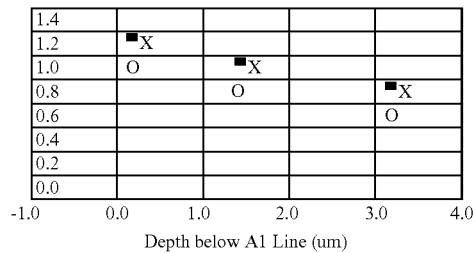 [SMILES: O ; O ; O]

The numbers on the left side of Chart I above are the Relative Tensile Stresses in oxide. The symbols O, X and ■ represent the thicknesses of the polyimide of 2 um, 3 um and 4 um, respectively. As shown by the Chart, the greater the depth in the oxide below the via and the thinner the polyimide, the lower the stress in the oxide.

Chart II below shows the oxide tensile stress at Point B of FIG. 2 as a function of polyimide thickness.

CHART II

Relative Stress in Oxide under BLM Edge vs Polyimide Thickness

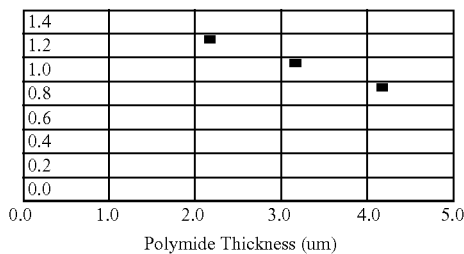

The numbers on the left side of the above Chart are the Relative Tensile Stresses in the oxide. The symbol ■ represent the particular thicknesses of the polyimide and the corresponding relative stress. This stress has the opposite trend in comparison to the stress under the via. That is, the stress increases as the polyimide layer becomes thinner or, as the polyimide becomes thicker, the stress at Point B decreases.

With the results of the modeling of the stress problem with Pb-free solder balls for C4 joining of integrated circuit chips to pads on a packaging substrate, the structure and method of the present invention was conceived and the preferred embodiment is shown in FIG. 3. Aspects of the invention include forming a thick, relatively soft insulating cushion 20, which is, in the present instant, polyimide and, specifically, photosensitive polyimide to function as a stress buffer. As shown FIG. 3, the cushion 20 is positioned to be aligned with the C4 Pb-free ball 21 and, preferably, is of a shape wherein the edges or periphery of the cushion are sloped upwardly to the cushion top. A connecting wire 23, herein aluminum, from a pad 22 on top of the cushion 20 is offset from the ball 21 as it connects to via pad 24 of the last or top wire connection 25, herein copper (Cu) of the integrated circuit chip 26. The wire 23 and the via pad 24 are within the fixed pitch of the C4 design. Pitch is defined as the distance between the center of adjacent C4 balls. More specifically, the polyimide cushion 20 is positioned in the C4 space areas and the aluminum (Al) wire or trace 23 is offset from the integral Al pad 22, preserving the fine pitch C4 layout dimensions. Isolated blocks of polyimide cushions 20 formed in this manner have the addition advantage of minimizing height of a final polyimide layer above via 25 and above the aluminum pad 22, as apparent from FIG. 3, which, in turn, minimizes the vertical delaminating stresses. This stress relief is in addition to the primary stress reduction mechanism associated with the structure of the present invention, which results from the stress buffer cushion 20 below the aluminum (Al) pad 22 together with offsetting the aluminum (Al) connecting wire 23 and pad 24 to the top metal wiring connection 25. In the present instance, the connection 25 is copper (Cu), in the integrated circuit chip 26, as shown in FIG. 3. This wiring connection 25 is capped by an insulating layer 27 which, herein, is a thin layer of silicon nitride. Above the cap 27 is another insulating layer 28 of a dual layer of silicon oxide and silicon nitride electrically insulating the Cu wiring connection 25 in the integrated circuit chip from the Al connecting wire 23, except at the via. To passivate the surface of the chip 26, an insulating layer 29, again a dual layer of silicon oxide and silicon nitride, is deposited on the Al connecting wire 23. This is followed by a thicker organic insulating layer 30, herein polyimide and specifically photosensitive polyimide, as a final passivating layer. A via 31 is formed in the both layers 29 and 30 to give access to the Al pad 22 over the cushion 20. In the via 31, a ball limiting material (BLM), such as TiW/CaNi, is deposited and it extends to the area to be covered by the Pb-free solder ball 21, which is now deposited. The solder ball 21 comprises a tin (Sn) alloy, such as AgSn or AgSnCu.

To illustrate in the present invention, the attachment of the C4 ball and the integrated circuit chip to a substrate of a package or circuit board as was shown and described relative to FIGS. 1 and 2, a substrate 33 is shown in FIG. 3 with a conductive pad 34 to which the solder ball 21 joins during reflow and contains a conductive wire 35 to connect circuits external to the chip.

Figure 4:
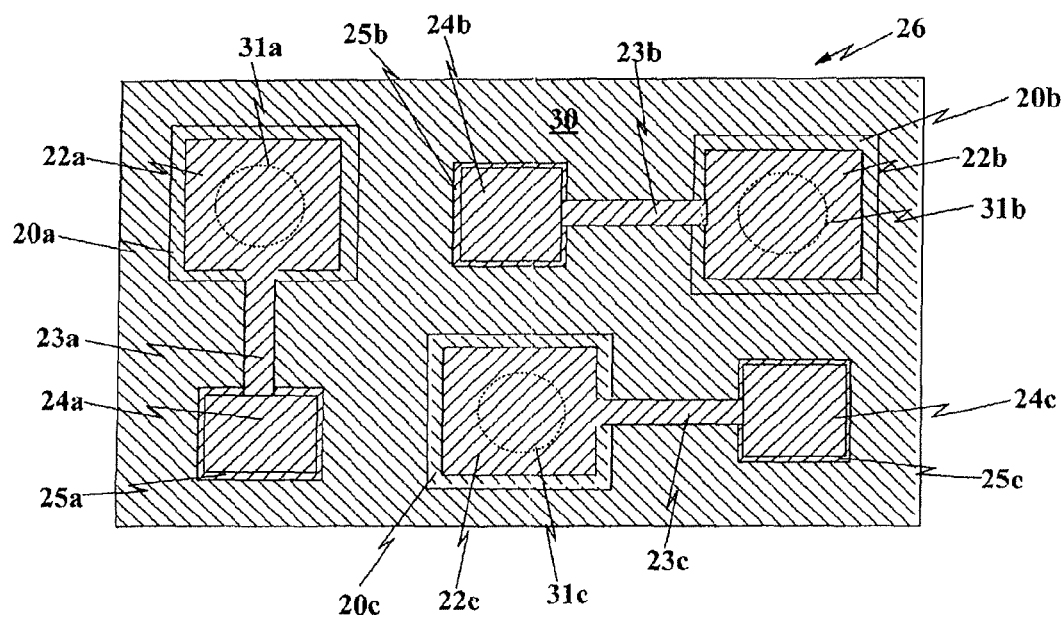
FIG. 4 is a plan view of a normal layout of the preferred embodiment of the present invention.

To further describe the present invention, FIG. 4 shows a plan view of three C4 Pb-free solder ball positions with aluminum pads 22a, 22b and 22c disposed on the face of an integrated circuit chip 26 with three associated connecting wires 23a, 23b and 23c to Al pads 24a, 24b and 24c, overlying herein Cu pads 25a, 25b and 25c, for connecting the solder ball to the last or top Cu metallization wires. In FIG. 4, for purposes of illustration, the face of the integrated circuit chip is shown covered with the final polyimide passivation layer 30 in all areas not containing C4 components and associated components. A dashed circle on the Al pads 22 represents a recess or the vias 31a, 31b and 31c in the polyimide layer 30. In an actual chip, only the dashed circle area or via 31 would not be covered by the passivating polyimide 30. For purposes of illustration, the polyimide cushion 20a, 20b and 20c surrounds and underlies C4 ball positions and is covered by their associated aluminum pads 22a, 22b and 22c. The pads are connected to wires 23a, 23b and 23c which, in turn, are connected to pads 24a, 24b and 24c. For stress relief, it will be noted that these pads and most of the length of the wires are offset from the C4 positions.

Figure 5:
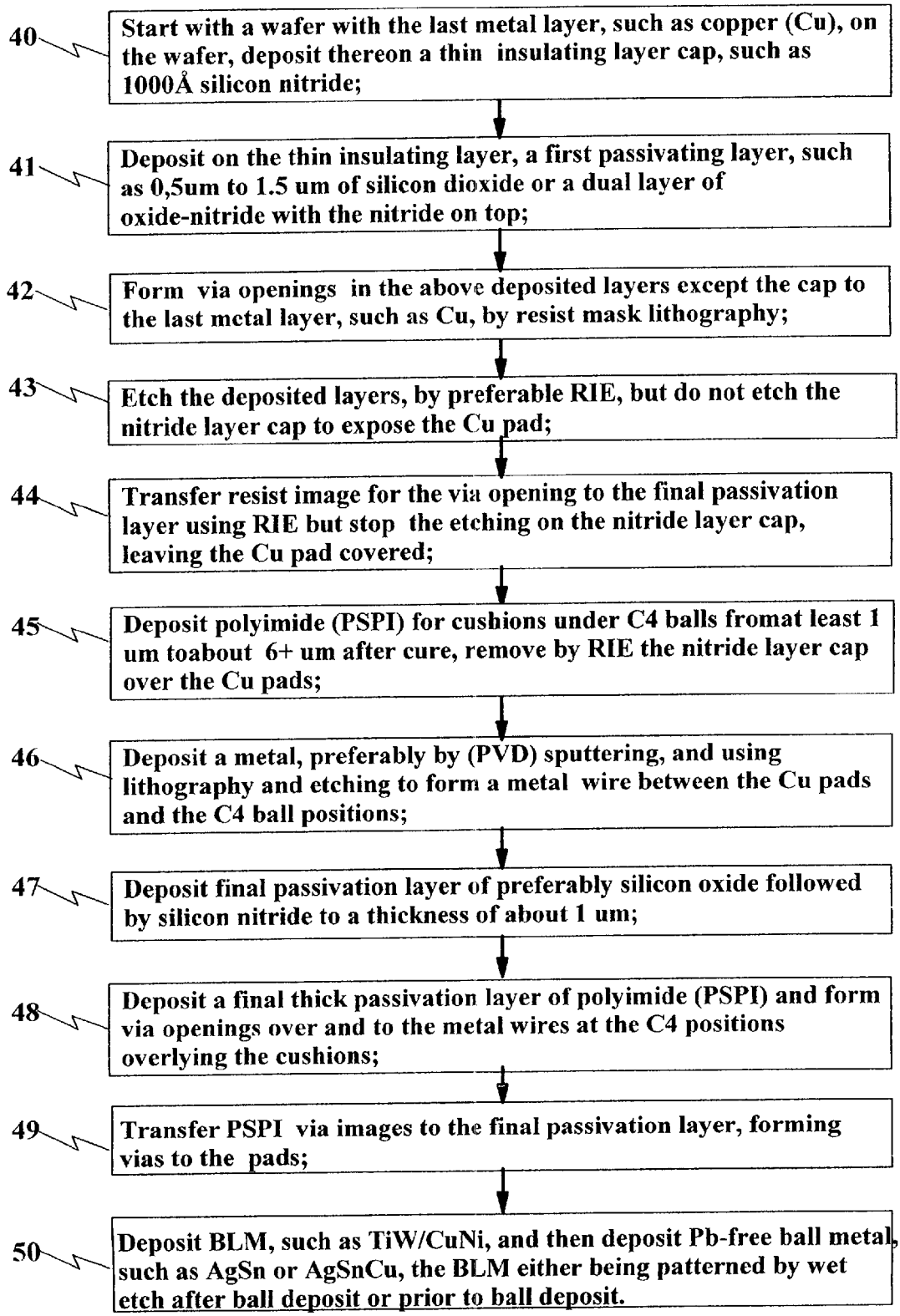
FIG. 5 is a flow diagram of the method of fabricating the Pb-free C4 solder balls by the present invention.

Turning now to the method of fabricating the Pb-free C4 solder balls without delaminating the insulating layers of an integrated circuit chip, FIG. 5 is a flow chart of the steps of the process of the present invention. The flow chart of FIG. 5 is sufficiently detail to not necessitate repeating the process details in the specification but merely correlate the process steps with the cross-section of the FIG. 3. The starting step of the present invention or step 40 in FIG. 5 is to deposit a thin insulating cap 27 (FIG. 3) on the top layer of metallization 25. This is followed by step 41 in which a thicker insulating layer 28 is deposited. A via opening at pad 25 is formed in the insulating layer 28 at step 42, but not the silicon nitride cap 27 which still covers the Cu pad. At step 43, the insulating silicon nitride cap 27 at the pad 25 is removed. The resist image for the via opening 25 is transferred to the final passivation layer 29 at step 44. Now, at step 45 polyimide, herein photosensitive polyimide is deposited for cushions 20. The polyimide is patterned for the number C4 positions, developed and cured. At step 46, the metal 22, 23 and 24, preferably integral Al, is deposited between the Cu pads 25 and the C4 position 31. A final passivation layer 29 is deposited at step 47 followed by depositing a thick passivation layer 30 of polyimide at step 48 with a via opening 31 formed at the C4 positions overlying the cushions 20. At step 49, a via is formed through insulating layer 29 to the Al metal pad 22. Now, at step 50, the BLM 32 and the Pb-free solder ball 21 are deposited in that order.

Figure 6:
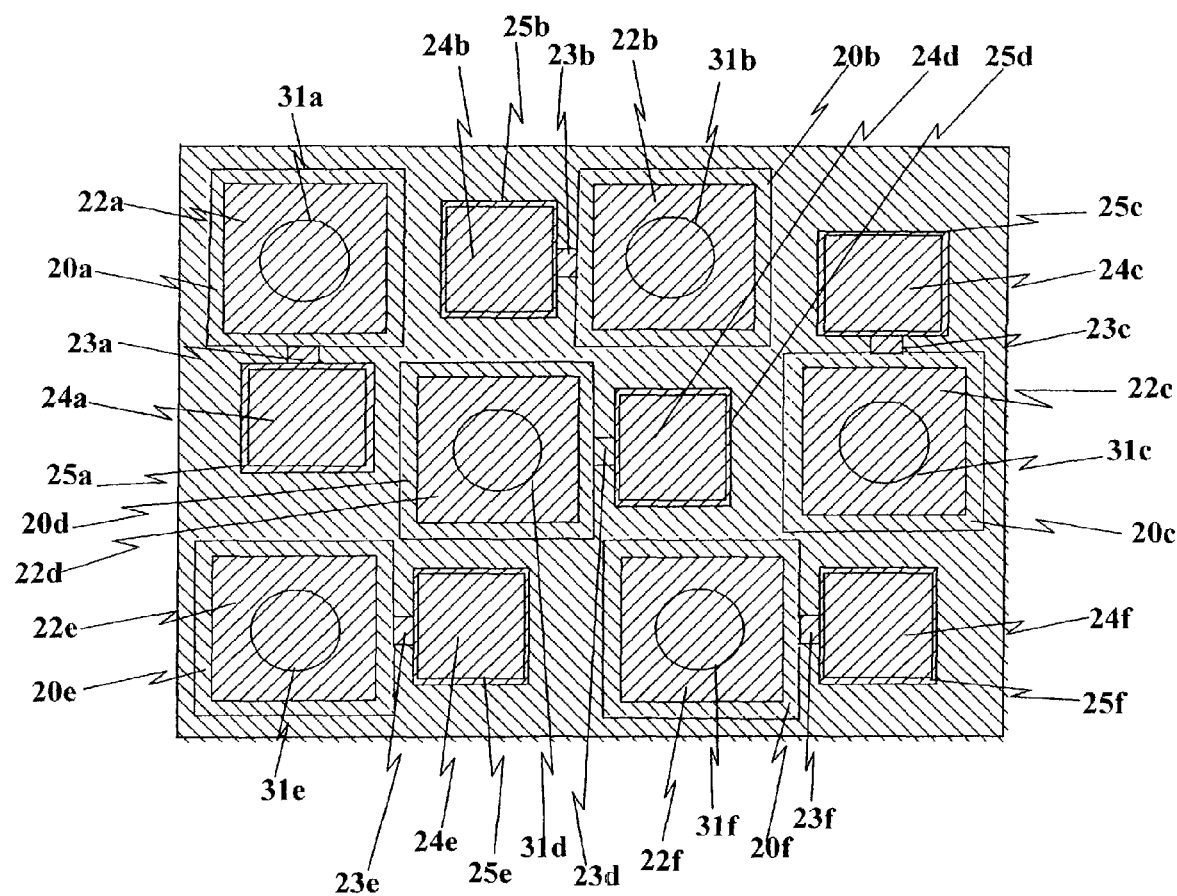
FIG. 6 is a plan view of a fine pitch layout of the preferred embodiment of the present invention.

FIG. 6 shows a plan view of a fine pitch layout, which is similar in concept to the layout of FIG. 4 but double the density. The connecting wire or trace 23 between the via 31 of the C4 position and the pad 24 over the Cu pad 25 is substantially shorter than the layout of FIG. 4. Otherwise, the structural layout of the two embodiments of FIG. 4 and FIG. 6 are the same, except that six C4 positions are present in FIG. 6. These six C4 positions have been labeled 20, 22, 23, 24, 25 and 31 "a" through "f" to correspond to the same elements as FIGS. 3 and 4.

Although the invention has been shown and described with respect to certain embodiments, equivalent alterations and modifications will occur to those skilled in the art upon reading and understanding this specification and drawings. In doing so, those skilled in the art should realize that such alterations and modifications are within the spirit and scope of the present invention as set forth in the appended claims and equivalents thereon. Those skilled in the art also will understand that the semiconductor structure described by the present inventive technique will be part of a larger semiconductor device incorporating a plurality of semiconductor devices. For example, the solder ball could be other than lead-free, if environmental dictates or health concerns are not controlling. In addition, the metal wiring in the integrated circuit chip could be other than copper and the trace wiring at and from the C4 positions could be other than aluminum. It is therefore intended that the appended claims encompass any modification or embodiment within the spirit of the present invention.

What is claimed is:

1. A method of providing stress relief to lead (Pb)-free controlled collapse chip connections (C4s) in an integrated circuit chip comprising the steps of:
providing an integrated circuit chip with its face covered with at least one insulating layer overlying top metallization of the integrated circuit chip, wherein the at least one insulating layer Comprises a first insulating layer having a first thickness on and contacting, the top metallization and a second insulating layer having a second thickness greater than the first thickness;
depositing a soft thick insulating layer on and substantially thicker than the at least one insulating layer at each of the positions of the C4 to form cushions under the bottom of the C4s for stress relief; each of said cushions surrounding a C4 position and with the edges or periphery of the cushion aligned with the C4 ball, when deposited;
forming vias through the insulating layer to the top metallization of the integrated circuit chip throughout the chip and not limited to the perimeter of the chip;
depositing metal pads in the vias and on the cushions and with a connecting metal wire between the pads;
depositing a passivating insulating layer on the metal pads and wire;
forming vias in the passivating layer to the metal pads over the cushions; and
depositing lead-free C4 solder balls aligned with the edges or periphery of the cushions.

2. The method of claim 1 wherein the C4 solder balls comprise a tin (Sn) containing, lead (Pb)-free composition.

3. The method of claim 1 wherein the pads to the top metallization are not in contact with the cushions which only are under the C4 positions for stress relief.

4. The method of claim 1 wherein a plurality of C4 positions are on the face of the chip with the distance between the positions or pitch being predetermined and the pads to the top metallization is within the pitch.

5. The method of claim 1 wherein the cushions comprise a thickness between 1 um and 6 um of polyimide, after cure.

6. The method of claim 1 wherein the cushions comprises photosensitive polyimide.

7. The method of claim 6 wherein the passivating layer comprises photosensitive polyimide with a reduced thickness because of the thick photosensitive polyimide cushions.

8. The method of claim 1 wherein the thick cushions are formed with downwardly sloping edges or periphery within the C4 positions and under the C4 balls, when deposited, to partially carry the metal wires to the metal pads.

9. The method of claim 1 wherein ball limiting metal (BLM) is formed on the cushion metal pads at the C4 positions to contain the solder balls.

10. The method of claim 1 wherein the C4 solder balls comprise a lead (Pb)-free, tin (Sn) alloy.

11. The method of claim 1, wherein:
the first insulating layer of the at least one insulating layer comprises silicon nitride; and
the second insulating layer of the at least one insulating layer comprises a dual layer of silicon oxide and silicon nitride.

12. The method of claim 1, wherein the passivating insulating layer is on and contacting each of: the second insulating layer of the at least one insulating layer; the metal pads; the connecting metal wire; and the cushion.

13. The method of claim 12, further comprising forming a second passivation layer on the passivating insulating layer.

14. The method of claim 13, wherein:
the passivating insulating layer comprises a dual layer of silicon oxide and silicon nitride; and
the second passivation layer comprises polyimide.

15. The method of claim 13, further comprising forming a ball limiting metallurgy layer on and contacting the passivating insulating layer, the second passivation layer, and one of the metal pads.

16. The method of claim 11, wherein:
the cushion comprises polyimide;
a sloped sidewall of the cushion is completely contained within a periphery of the C4 solder ball; and
the top metallization is outside the periphery of the C4 solder ball.

17. A method of providing stress relief to lead (Pb)-free controlled collapse chip connections (C4s) in an integrated circuit chip comprising the steps of:
forming a first insulating layer on a top metallization of the integrated circuit chip;
forming a second insulating layer on the first insulating layer, wherein the second insulating layer is thicker than the first insulating layer;
forming an opening in the first insulating layer and the second insulating layer to expose a portion of the top metallization;
forming a cushion on the second insulating layer at a location laterally offset from the top metallization, wherein the cushion comprises photosensitive polyimide, and wherein the cushion is thicker than a combined thickness of first insulating layer and the second insulating layer;
forming a metal layer comprising: a first metal pad in the opening and on the top metallization; a second metal pad on the cushion; and a wire extending between and connecting the first metal pad and the second metal pad;
forming a first final passivation layer comprising nitride on the second insulating layer, the metal layer, and the cushion;
forming a second final passivation layer comprising polyimide on the first final passivation layer;
forming a via opening in the first final passivation layer and the second final passivation layer that exposes a portion of the second metal pad;
forming a ball limiting metallurgy (BLM) layer on exposed surfaces of the first final passivation layer, the second final passivation layer, and the cushion; and
forming a lead-free C4 solder ball on the BLM layer and aligned with the cushion.

18. The method of claim 17, wherein:
a sloped sidewall of the cushion is completely contained within a periphery of the C4 solder ball; and
the top metallization is outside the periphery of the C4 solder ball.

19. The method of claim 18, wherein:
the first insulating layer comprises silicon nitride;
the second insulating layer comprises silicon dioxide or a dual layer of silicon oxide and silicon nitride; and
the first final passivation layer comprises an upper dual layer of silicon oxide and silicon nitride.

20. The method of claim 19, wherein the top metallization and the C4 solder ball are at an interior of the integrated circuit chip away from a perimeter of the integrated circuit chip.

* * * * *